United States Patent
Hung et al.

(10) Patent No.: US 11,497,131 B2
(45) Date of Patent: Nov. 8, 2022

(54) ELECTRICAL CONNECTORS WITH LINK MEMBERS

(71) Applicant: HEWLETT-PACKARD DEVELOPMENT COMPANY, L.P., Houston, TX (US)

(72) Inventors: Cary Hung, Taipei (CN); Chien Hao Chen, Taipei (CN)

(73) Assignee: Hewlett-Packard Development Company, L.P., Spring, TX (US)

( * ) Notice: Subject to any disclaimer, the term of this patent is extended or adjusted under 35 U.S.C. 154(b) by 1127 days.

(21) Appl. No.: 16/076,991

(22) PCT Filed: Mar. 14, 2017

(86) PCT No.: PCT/US2017/022219
§ 371 (c)(1),
(2) Date: Aug. 9, 2018

(87) PCT Pub. No.: WO2018/169513
PCT Pub. Date: Sep. 20, 2018

(65) Prior Publication Data
US 2021/0176884 A1    Jun. 10, 2021

(51) Int. Cl.
*H05K 7/14*      (2006.01)
*H01R 12/70*     (2011.01)
(Continued)

(52) U.S. Cl.
CPC ....... *H05K 7/1431* (2013.01); *H01R 12/7029* (2013.01); *H01R 12/721* (2013.01);
(Continued)

(58) Field of Classification Search
CPC .............. H05K 7/1431; H05K 7/1409; H01R 12/7029; H01R 12/721; H01R 12/737; H01R 13/6271
(Continued)

(56) References Cited

U.S. PATENT DOCUMENTS 5,368,493 A     11/1994   O'Brien et al.
6,796,817 B2    9/2004    Wrycraft
(Continued)

FOREIGN PATENT DOCUMENTS

KR        200393505 Y1      8/2005
KR    20080045877 A *       1/2009
(Continued)

OTHER PUBLICATIONS

Austin, "ASUS X99 Deluxe II Motherboard Review", ASUS, Retrieved from internet—http://www.overclockers.com/asus-x99-deluxe-ii-motherboard-review, Aug. 8, 2016, 18 Pages.

*Primary Examiner* — Anatoly Vortman
*Assistant Examiner* — Zhengfu J Feng
(74) *Attorney, Agent, or Firm* — HP Inc. Patent Department

(57) ABSTRACT

An example electrical connector includes a body to receive a circuit board. The body includes a first end and a second end. The electrical connector also includes a first latch rotatably attaches to the first end. The electrical connector further includes a second latch rotatably attaches to the second end. The electrical connector further includes a link member attached to the body. In response to a rotation of the first latch, the link member is to slide across the body from the first latch towards the second latch to rotate the second latch.

14 Claims, 3 Drawing Sheets

(51) Int. Cl.
*H01R 12/72* (2011.01)
*H01R 12/73* (2011.01)
*H01R 13/627* (2006.01)

(52) U.S. Cl.
CPC ....... *H01R 12/737* (2013.01); *H01R 13/6271* (2013.01); *H05K 7/1409* (2013.01)

(58) Field of Classification Search
USPC ........................................................ 361/801
See application file for complete search history.

(56) References Cited

U.S. PATENT DOCUMENTS

| | | | |
|---|---|---|---|
| 7,435,114 B2 * | 10/2008 | Desrosiers | G06F 1/186 |
| | | | 439/372 |
| 2005/0243533 A1 | 11/2005 | Malone et al. | |
| 2006/0067063 A1 * | 3/2006 | Stahl | H05K 7/1409 |
| | | | 361/759 |
| 2012/0322287 A1 | 12/2012 | Lu | |
| 2015/0349440 A1 * | 12/2015 | Seok | H01R 12/737 |
| | | | 439/637 |

FOREIGN PATENT DOCUMENTS

| | | | | |
|---|---|---|---|---|
| KR | 20090007135 | A | * | 1/2009 |
| KR | 20090007135 | A | | 1/2009 |
| KR | 100939279 | B1 | * | 1/2010 |
| KR | 101029122 | B1 | * | 4/2011 |
| KR | 101029122 | B1 | | 4/2011 |

\* cited by examiner

ELECTRICAL CONNECTORS WITH LINK MEMBERS

BACKGROUND

A computing device, such as a notebook computer, may include a motherboard that provides a plurality of hardware interfaces to receive different components, such as memory modules.

BRIEF DESCRIPTION OF THE DRAWINGS

Some examples of the present application are described with respect to the following figures.

DETAILED DESCRIPTION

A motherboard of a computing device may include an electrical connector to receive a circuit board. For example, the electrical connector may be a socket to receive as a memory module. When a user of the computing device is to replace or upgrade the circuit board, the user may manually remove the circuit board via an ejection mechanism of the electrical connector. However, as computing devices are trending towards smaller and smaller size, the available space for a user to access different components inserted into a motherboard is also reduced. There may not be sufficient space for a user to remove the circuit board without removing other neighboring circuit boards. Thus, difficulty of ejecting a circuit board from an electrical connector may be increased.

Examples described herein provide an electrical connector where an inserted circuit board may be ejected via a link member of the electrical connector. For example, an electrical connector may include a body to receive a circuit board. The body may include a first end and a second end. The electrical connector may also include a first latch rotatably attached to the first end. The electrical connector may also include a second latch rotatably attached to the second end. The electrical connector may further include a link member attached to the body. In response to a rotation of the first latch, the link member may slide across the body from the first latch towards the second latch to rotate the second latch. In this manner, examples described herein may reduce the difficulty of ejecting a circuit board from an electrical connector.

Figure 1:
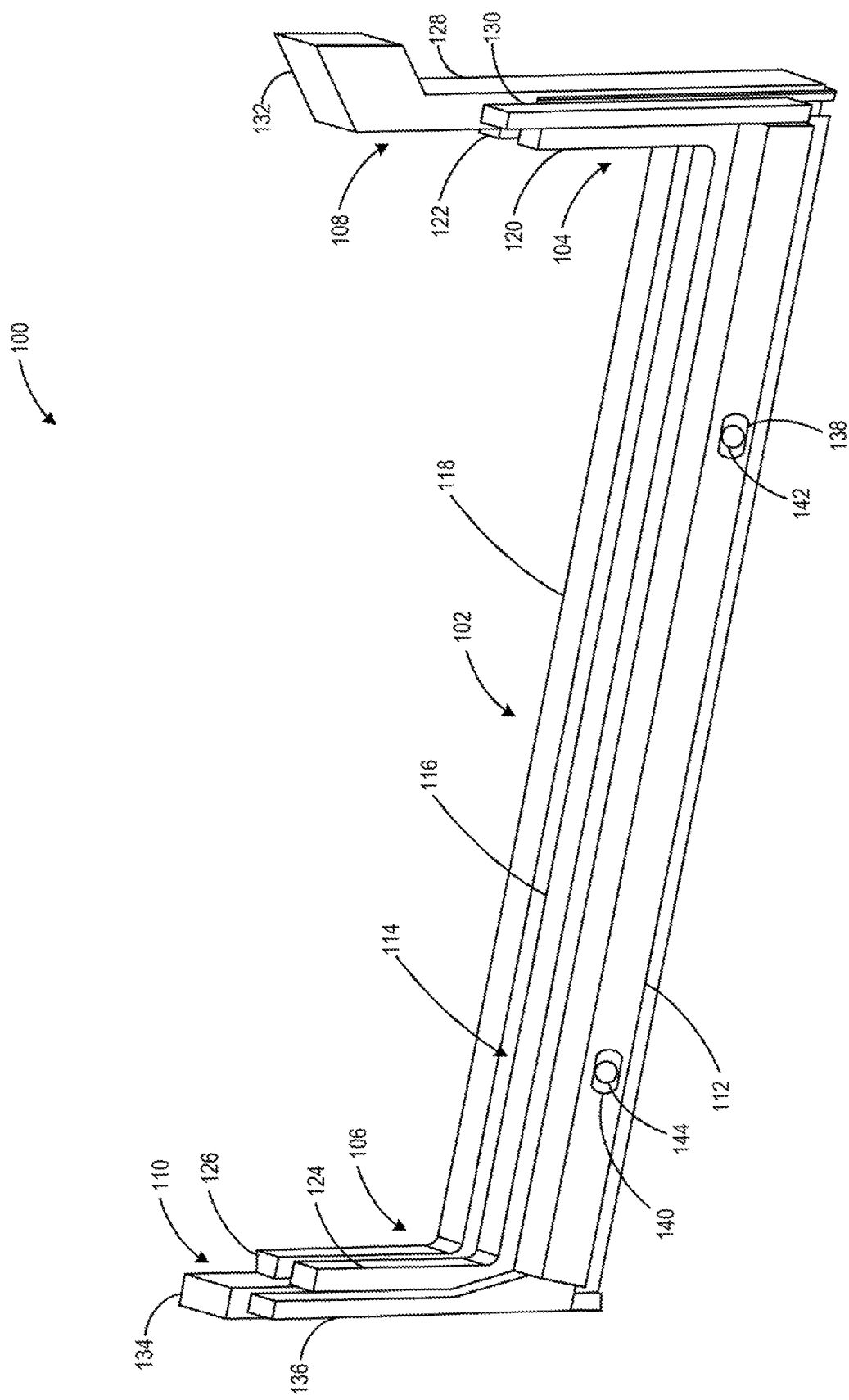
FIG. 1 illustrates a perspective view of an electrical connector with a link member to eject an Inserted circuit board, according to an example.

FIG. 1 illustrates a perspective view of an electrical connector 100 with a link member to eject an inserted circuit board, according to an example. Electrical connector 100 may a hardware interface that enables electrical communication between two circuit boards. For example, electrical connector 100 may be a memory socket that enables electrical communication between a motherboard where electrical connector 100 is mounted and a memory module inserted into electrical connector 100. In some examples, electrical connector 100 may receive other circuit boards, such as a video card, a sound card, a network card, and other components of a computing device.

Electrical connector 100 may include a body 102, a first end 104, a second end 106, a first latch 108, a second latch 110, and a link member 112. Body 102 may define a slot 114 to receive a circuit board, such as a memory module. A plurality of electrical contacts (not shown in FIG. 1) may be embedded in slot 114 to enable electrical communication between the circuit board and another circuit board that includes electrical connector 100.

Body 102 may include a pair of frame members: a first frame members 116 and a second frame member 118. First end 104 may include a pair of guide members: a first guide member 120 and a second guide member 122. Second end 106 may include a pair of guide members: a third guide member 124 and a fourth guide member 126. Guide members 120 and 124 may be part of first frame member 116. Guide members 122 and 126 may be part of second frame member 118. Guide members 120, 122, 124, and 126 may help a circuit board to be aligned with slot 114 during insertion into slot 114.

First latch 108 may include a first latch body 128, a first engagement member 130, and a lever 132. Lever 132 may extend from latch body 128. First latch 108 may be rotatably attached to first end 104 via first latch body 128. For example, first latch body 128 may be attached to guide members 120 and 122 via a pin (not shown in FIG. 1). First engagement member 130 may extend from first latch body 128. First engagement member 130 and first latch body 128 may define an opening such that first guide member 120 may be situated in the opening. Thus, first guide member 120 may be situated between first latch body 128 and first engagement member 130.

Second latch 110 may include a second latch body 134 and a second engagement member 136. Second latch 110 may be rotatably attached to second end 106 via second latch body 134. For example, second latch body 134 may be attached to guide members 124 and 126 via a pin (not shown in FIG. 1). Second engagement member 136 may extend from second latch body 134. Second engagement member 136 and second latch body 134 may define an opening such that third guide member 124 may be situated in the opening. Thus, third guide member 124 may be situated between second latch body 134 and second engagement member 136.

Link member 112 may include a set of openings, such as a first opening 138 and a second opening 140. Link member 112 may be attached to body 102 of electrical connector 100 via openings 138 and 140. For example, body 102 may include a first attachment member 142 and a second attachment member 144. Attachment members 142 and 144 may extend from a side of first frame member 116. First attachment member 142 may be received in first opening 138. Second attachment member 144 may be received in second opening 140. Openings 138 and 140 may be dimensioned so that link member 112 may slide laterally with respect to body 102 using attachment members 142 and 144 as support.

During operation, first latch 108 may rotate to push link member 112 towards second latch 110 via first engagement member 130. Link member 112 may push second engagement member 136 to rotate second latch 110. Thus, second latch 110 may rotate subsequent to the rotation of first latch 108. The rotations of latches 108 and 110 may enable an ejection of a circuit board from slot 114. Operations of electrical connector 100 are described in more detail in FIGS. 2A-2C.

Figure 2A:
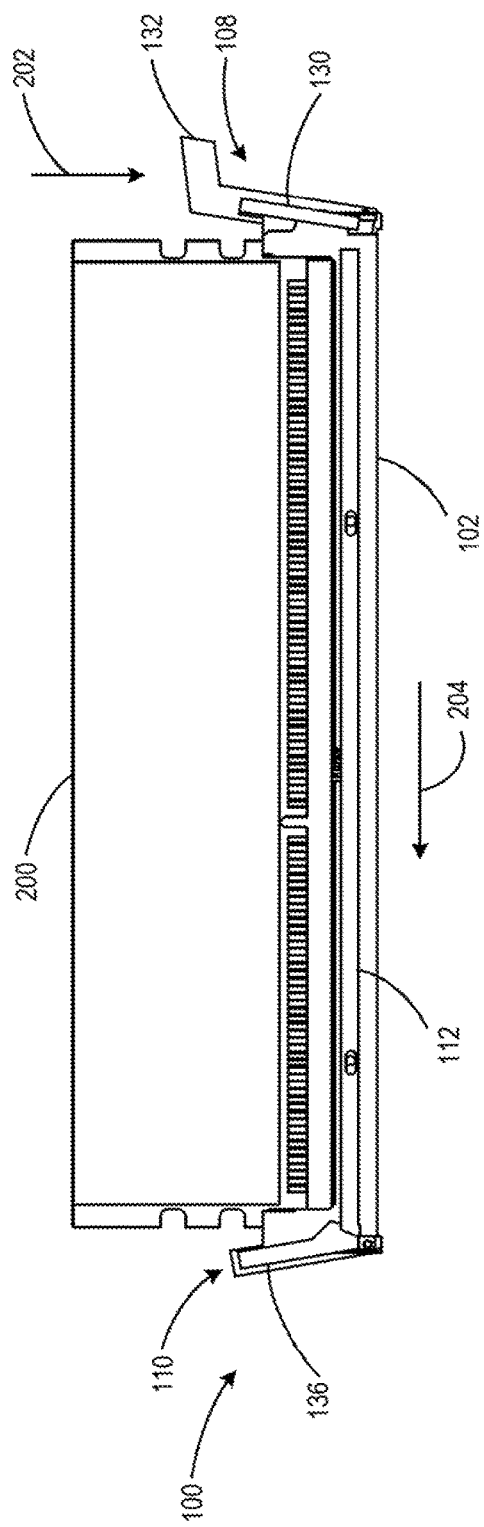
FIG. 2A illustrates a perspective view of the electrical connector of FIG. 1 to eject the circuit board via the link member, according to an example.

FIG. 2A illustrates a perspective view of electrical connector 100 of FIG. 1 to eject a circuit board 200 via link member 112, according to an example. During operation, circuit board 200 may be inserted into electrical connector 100. To eject circuit board 200 from electrical connector 100, an external force may be applied to lever 132 in a downward direction towards lever 132 as shown by an arrow 202. The external force may be applied by a user. In response to the external force, first latch 108 may rotate away from body 102. The rotation of first latch 108 may eject one side of circuit board 200. The rotation of first latch 108 may also enable first engagement member 130 to push link member 112 to slide across body 102 from first latch 108 towards second latch 110 as shown by an arrow 204.

In response to the rotation of first latch 108, the lateral slide of link member 112 relative to body 102 may apply a pushing force to second engagement member 136 to rotate second latch 110. The rotation of second latch 110 may eject the other side of circuit board 200. Thus, circuit board 200 may be fully ejected from electrical connector 100. By using link member 112 to rotate second latch 110, a user may be able eject circuit board 200 by pressing on lever 132 using a single hand rather than using two hands to rotate both latches 108 and 110. Thus, the difficulty of ejecting circuit board 200 may be reduced.

In some examples, link member 112 may be in physical contact with first engagement member 130 intermittently while being in physical contact with second engagement member 136 continuously. For example, when circuit board 200 is inserted into electrical connector 100, both latches 108 and 110 may be in a resting position (i.e., not rotated away from body 102). Link member 112 may be in physical contact with both engagement members 130 and 136.

When first latch 108 has rotated a particular degree away from body 102, link member 112 may be pushed far enough away towards second latch 110 that link member 112 is no longer in physical contact with first engagement member 130 while remaining in physical contact with second engagement member 136, as shown in FIG. 2A. When circuit board 200 is being inserted into electrical connector 100, the insertion of circuit board 200 may cause latches 108 and 110 to rotate back towards body 102. As second latch 110 is rotating back towards body 102, second engagement member 136 may push link member 112 to slide across body 102 from second latch 110 towards first latch 108. As link member 112 is sliding back towards first latch 108 and first latch 108 is rotating back towards body 102, link member 112 may be in physical contact with first engagement member 130 again.

In some examples, link member 112 may be in continuous physical contact with both engagement members 130 and 136. For example, first engagement member 130 may be dimensioned so that link member 112 may remain in physical contact with first engagement member 130 even after link member 112 has caused second latch 110 to rotate away from body 102 fully. In another example, link member 112 may be dimensioned so that link member 112 may remain in physical contact with first engagement member 130 even after link member 112 has caused second latch 110 to rotate away from body 102 fully.

Figure 2B:
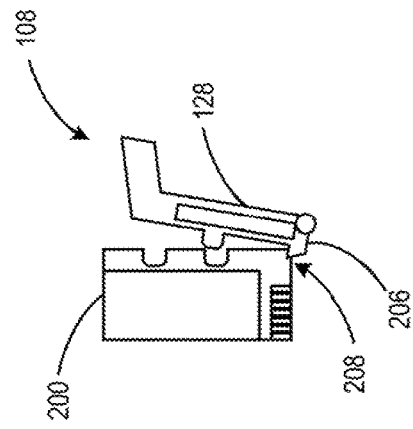
FIG. 2B illustrates a perspective view of a first latch of the electrical connector of FIG. 2A rotated to eject a circuit board from the electrical connector, according to an example.

FIG. 2B illustrates a perspective view of first latch 108 of electrical connector 100 of FIG. 2A rotated to eject circuit board 200 from electrical connector 100, according to an example. First latch 108 may include a first reception tab 206 that extends from first latch body 128. First reception tab 206 may be situated between frame members 116 and 118 of FIG. 1. First reception tab 206 may engage a first bottom region 208 of circuit board 200. For example, when circuit board 200 is inserted into electrical connector 100 (not shown in FIG. 2B), first bottom region 208 may come into physical contact with first reception tab 206 to cause first latch 108 to rotate towards circuit board 200. When first latch 108 is rotating away from circuit board 200, first reception tab 206 may lift first bottom region 208 away from electrical connector 100, partially ejecting circuit board 200 from electrical connector 100.

Figure 2C:
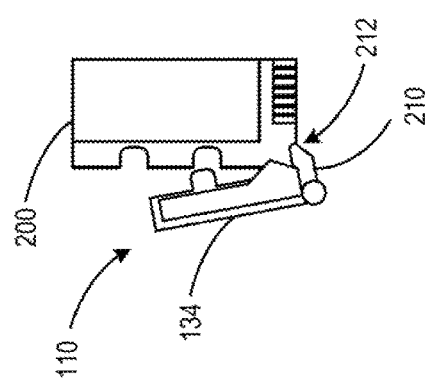
FIG. 2C illustrates a perspective view of a second latch of the electrical connector of FIG. 2A rotated to eject a circuit board from the electrical connector, according to an example.

FIG. 2C illustrates a perspective view of second latch 110 of electrical connector 100 of FIG. 2A rotated to eject circuit board 200 from electrical connector 100, according to an example. Second latch 110 may include a second reception tab 210 that extends from second latch body 134. Second reception tab 210 may be situated between frame members 116 and 118 of FIG. 1. Second reception tab 210 may engage a second bottom region 212 of circuit board 200. For example, when circuit board 200 is inserted into electrical connector 100 (not shown in FIG. 2B), second bottom region 212 may come into physical contact with second reception tab 210 to cause second latch 110 to rotate towards circuit board 200. When second latch 110 is rotating away from circuit board 200, second reception tab 210 may lift second bottom region 212 away from electrical connector 100, partially ejecting circuit board 200 from electrical connector 100. Thus, reception tabs 206 and 210 may together fully reject circuit board 200 from electrical connector 100.

Figure 3:
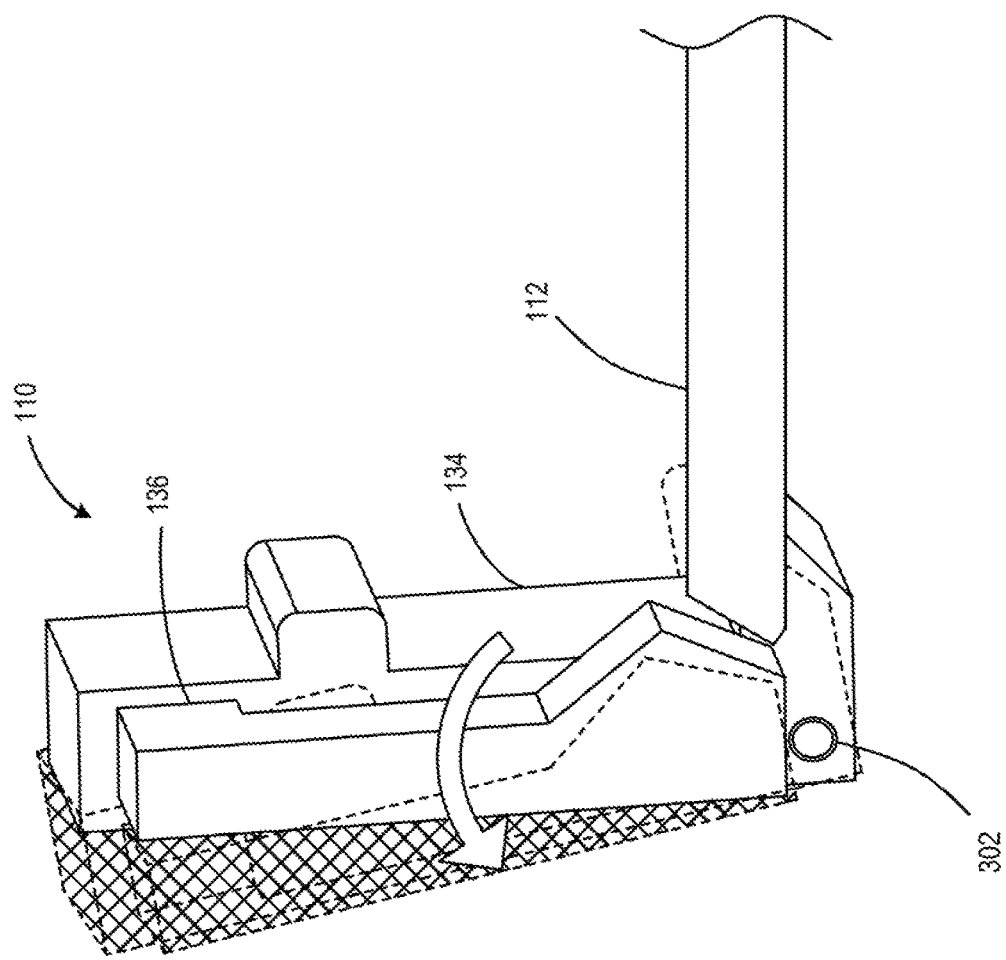
FIG. 3 illustrates a perspective view of a rotation of a latch of an electrical connector in response to a push by a link member of the electrical connector, according to an example.

FIG. 3 illustrates a perspective view of a rotation of second latch 110 of electrical connector of FIG. 1 in response to a push by link member 112 of electrical connector 100, according to an example. Second latch 110 may include a rotation point 302 in second latch body 134. Rotation point 302 may define an axis of rotation for second latch 110. In some examples, rotation point 302 may be an opening to receive a pin that attaches second latch 110 to body 102 of electrical connector 100 of FIG. 1. Link member 112 may be positioned above rotation point 302 so that link member 112 may push second engagement member 136 to rotate second latch 110.

The use of "comprising", "including" or "having" are synonymous and variations thereof herein are meant to be inclusive or open-ended and do not exclude additional unrecited elements or method steps.

What is claimed is:
1. An electrical connector comprising:
  a body to receive a circuit board, wherein the body includes a first end and a second end;
  a first latch rotatably attached to the first end;
  a first engagement member coupled to the first latch;
  a second latch rotatably attached to the second end;
  a second engagement member coupled to the second latch; and
  a link member attached to the body, wherein, in response to a rotation of the first latch, the link member is to slide across the body from the first latch towards the second latch to rotate the second latch;
  wherein the link member is in physical contact with the first engagement member intermittently, and wherein the link member is in physical contact with the second engagement member continuously.

2. The electrical connector of claim 1, wherein the body includes an attachment member, wherein the link member includes an opening, and wherein the link member is attached to the attachment member via the opening.

3. The electrical connector of claim 1, wherein the first latch includes a latch body and the first engagement member extending from the latch body, and wherein the first engagement member and the latch body define an opening.

4. The electrical connector of claim 3, wherein the first end includes a pair of guide members, wherein the latch body is situated between the pair of guide members, and wherein one of the pair of guide members is situated in the opening.

5. The electrical connector of claim 3, wherein the first engagement member is to push the link member to slide across the body.

6. The electrical connector of claim 1, wherein the link member is positioned above a rotation point of the second latch.

7. An electrical connector comprising:
a body to receive a circuit board, wherein the body includes a first end and a second end;
a first latch rotatably attached to the first end;
a first engagement member coupled to the first latch;
a second latch rotatably attached to the second end;
a second engagement member coupled to the second latch; and
a link member attached to the body, wherein, in response to a rotation of the first latch, the link member is to slide laterally relative to the body to rotate the second latch;
wherein the link member is in physical contact with the first engagement member intermittently, and wherein the link member is in physical contact with the second engagement member continuously.

8. The electrical connector of claim 7, wherein the second latch is to be rotated subsequent to the rotation of the first latch.

9. The electrical connector of claim 7, wherein the first latch includes a lever, and wherein the rotation of the first latch is in response to a downward force applied to the lever.

10. The electrical connector of claim 7, wherein the second latch includes a latch body and the second engagement member extending from the latch body, wherein the second latch is to rotate in response to a pushing force applied to the second engagement member via the link member.

11. An electrical connector comprising:
a body to receive a circuit board, wherein the body includes a first end and a second end;
a first latch rotatably attached to the first end;
a first engagement member coupled to the first latch;
a second latch rotatably attached to the second end;
a second engagement member coupled to the second latch; and
a link member attached to the body, wherein the link member is offset from the first end and the second end, and wherein, in response to a rotation of the first latch, the first latch is to push the link member towards the second latch to rotate the second latch;
wherein the link member is in physical contact with the first engagement member intermittently, and wherein the link member is in physical contact with the second engagement member continuously.

12. The electrical connector of claim 11, wherein the second latch is to be rotated subsequent to the rotation of the first latch.

13. The electrical connector of claim 11, wherein the link member is positioned above a rotation point of the second latch.

14. The electrical connector of claim 11, wherein the first latch includes a lever, and wherein the rotation of the first latch is in response to a downward force applied to the lever.

* * * * *